United States Patent
Bidichandani et al.

(10) Patent No.: US 8,254,866 B1
(45) Date of Patent: *Aug. 28, 2012

(54) LOW NOISE AMPLIFIER GAIN ADAPTION BASED ON A RECEIVED SIGNAL STRENGTH INDICATION OF BLUETOOTH AND WLAN SIGNALS

(75) Inventors: Sameer Bidichandani, Los Gatos, CA (US); Ronak Anjan Chokshi, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/285,978

(22) Filed: Oct. 31, 2011

Related U.S. Application Data

(63) Continuation of application No. 12/410,021, filed on Mar. 24, 2009, now Pat. No. 8,055,230.

(60) Provisional application No. 61/039,279, filed on Mar. 25, 2008.

(51) Int. Cl.
  *H04B 1/06* (2006.01)
(52) U.S. Cl. ............... 455/232.1; 455/67.11; 455/226.1
(58) Field of Classification Search ............... None
  See application file for complete search history.

(56) References Cited

U.S. PATENT DOCUMENTS

| | | | |
|---|---|---|---|
| 6,873,832 B2 | 3/2005 | Shi | |
| 7,242,915 B2 | 7/2007 | Shi | |
| 7,429,891 B2 * | 9/2008 | Darabi et al. | 330/132 |
| 8,055,230 B1 * | 11/2011 | Bidichandani et al. | 455/232.1 |
| 2005/0079841 A1 * | 4/2005 | Astrachan et al. | 455/226.2 |

OTHER PUBLICATIONS

Part 11: Wireless LAN Medium Access Control (MAC) and Physical Layer (PHY) specifications, High-speed Physical Layer in the 5 GHz Band, IEEE, Std 802.11a-1999, pp. 1-93.

Part 11: Wireless LAN Medium Access Control (MAC) and Physical Layer (PHY) specifications, Amendment 2: Higher-speed Physical Layer (PHY) extension in the 2.4 GHz band—Corrigendum 1, IEEE, Std 802.11b-1999/Cor 1-2001, Nov. 7, 2001, pp. 1-23.

Part 11: Wireless LAN Medium Access Control (MAC) and Physical Layer (PHY) specifications, Further Higher Data Rate Extension in the 2.4 GHz Band, IEEE, P802.11g/D8.2, Apr. 2003, pp. 1-69.

* cited by examiner

*Primary Examiner* — Long Nguyen

(57) ABSTRACT

A method and system for controlling a gain of a low noise amplifier to be applied to i) a first signal from a first communication device, and ii) a second signal from a second communication device, in which i) the first signal conforms to a first communication protocol, and ii) the second signal conforms to a second communication protocol. The method includes determining a first signal strength indicator corresponding to a signal strength of the first signal; determining a second signal strength indicator corresponding to a signal strength of the second signal; and controlling the gain of the low noise amplifier based on at least i) the first signal strength indicator and ii) the second signal strength indicator.

20 Claims, 3 Drawing Sheets

LOW NOISE AMPLIFIER GAIN ADAPTION BASED ON A RECEIVED SIGNAL STRENGTH INDICATION OF BLUETOOTH AND WLAN SIGNALS

CROSS-REFERENCE TO RELATED APPLICATIONS

This present disclosure is a continuation of U.S. application Ser. No. 12/410,021, filed on Mar. 24, 2009, now U.S. Pat. No. 8,055,230, which claims priority under 35 U.S.C. §119(e) to U.S. Provisional Patent Application No. 61/039,279, filed Mar. 25, 2008.

BACKGROUND

The increase in the number of handheld platforms in the recent years has created a need to integrate multiple wireless networking technologies on one communication integrated circuit (IC). Of these, the two most widely used wireless networking technologies are wireless local area network (WLAN) (a.k.a., Wi-Fi) and Bluetooth. WLAN and Bluetooth both occupy a section of the 2.4 GHz Industrial, Scientific, and Medical ("ISM") band.

Bluetooth is an industrial specification that can be used for wireless personal area networks ("PANs"). Bluetooth can be particularly useful when transferring information between two or more devices that are near each other in low-bandwidth situations. Bluetooth can be used to connect and exchange information between devices such as mobile phones, laptops, personal computers, hand-held computers, printers, digital cameras, and video game consoles. Common applications of Bluetooth can include wireless control of and communication between a mobile phone and a hands-free headset (e.g., a Bluetooth earbud), wireless networking between computers for certain applications, and wireless communications between a computer and input and output devices (e.g., mice, keyboards, and printers). Bluetooth uses Frequency Hopping Spread Spectrum ("FHSS") and is allowed to hop between 79 different 1 MHz-wide channels in the ISM band.

WLAN refers to wireless technology based upon the IEEE 802.11 standards generally used for local area networking. Common applications for WLAN include internet access and network connectivity for consumer electronics. WLAN generally uses the same radio frequencies as Bluetooth, but operates using higher power, generally resulting in a stronger connection that can cover a greater distance. WLAN uses Direct Sequence Spread Spectrum (DSSS) instead of FHSS. Its carrier does not hop or change frequency, and is instead maintained on one channel that is 22 MHz-wide. There is room for 11 overlapping WLAN channels in the ISM band, but there is only room for three non-overlapping channels. This means that no more than three different WLAN networks may operate in close proximity to one another.

Because both WLAN and Bluetooth wireless technology share spectrum and can often be located in close physical proximity to one another, there is a likelihood that some interference will occur. While WLAN and Bluetooth technology can continue to function during interference, increasing levels of interference can result in a slowing of the data rate as more packets need to be resent. In some conditions of extreme interference, communications can cease altogether.

Although both WLAN and Bluetooth use the same unlicensed 2.4 GHz ISM band, the link layer protocol used for communication over each of these two technologies is very different. This poses a difficult problem for designing integrated circuits (ICs) and external logic components that are capable of running link layer protocols for both WLAN and Bluetooth. In other words, in order for the end-user to use both WLAN and Bluetooth on the same device simultaneously, these two technologies are required to coexist with each other both in time and frequency. Among others, appropriate Time Division Duplex (TDD) and RF isolation techniques are sought after to resolve this problem.

SUMMARY

A method for adapting low noise amplifier gain comprises determining a Bluetooth received signal strength indication of Bluetooth signals transmitted by a Bluetooth peer; determining a WLAN received signal strength indication of WLAN signals transmitted by a WLAN peer; comparing the Bluetooth received signal strength indication to a predetermined Bluetooth signal strength threshold to determine a Bluetooth peer distance of the Bluetooth peer; comparing the WLAN received signal strength indication to a predetermined WLAN signal strength threshold to determine a WLAN peer distance of the WLAN peer; and controlling a gain of a low noise amplifier to be applied to the Bluetooth signals and the WLAN signals based on the Bluetooth peer distance and the WLAN peer distance.

In a further embodiment, the gain may be controlled by using a bypass signal to place the low noise amplifier into at least one of (a) a bypass mode in which the Bluetooth signals and the WLAN signals pass through the low noise amplifier without the gain being applied, and (b) a fixed gain mode in which the gain is applied to the Bluetooth signals and the WLAN signals. In one embodiment, the gain may be controlled by using the bypass signal to control an internal WLAN low noise amplifier and an internal Bluetooth low noise amplifier.

A system embodiment comprises a radio frequency front-end configured to handle communication of Bluetooth signals and WLAN signals, the radio frequency front-end comprising a low noise amplifier coupled to a path dedicated to simultaneous communication of the Bluetooth signals and the WLAN signals; and a communication module coupled to the radio frequency front-end, the transceiver including a gain adaption algorithm configured to: determine a Bluetooth received signal strength indication of the Bluetooth signals transmitted by a Bluetooth peer; determine a WLAN received signal strength indication of the WLAN signals transmitted by a WLAN peer; compare the Bluetooth the received signal strength indication to a predetermined Bluetooth signal strength threshold to determine a Bluetooth peer distance of the Bluetooth peer; compare the WLAN received signal strength indication to a predetermined WLAN signal strength threshold to determine a WLAN peer distance of the WLAN peer; and control a gain of the low noise amplifier to be applied to the Bluetooth signals and the WLAN signals based on the Bluetooth peer distance and the WLAN peer distance.

In a further embodiment, the gain adaption algorithm uses a bypass signal to control the gain by placing the low noise amplifier into at least one of (a) a bypass mode in which the Bluetooth signals and WLAN signals pass through the low noise amplifier without the gain being applied, and (b) a fixed gain mode in which the gain is applied to the Bluetooth signals and the WLAN signals. In one embodiment, the gain adaption algorithm uses the bypass signal to control an internal WLAN low noise amplifier and an internal Bluetooth low noise amplifier.

DETAILED DESCRIPTION

The present invention relates to low noise amplifier (LNA) gain adaption based on a received signal strength indication of Bluetooth and WLAN signals. The following description is presented to enable one of ordinary skill in the art to make and use the invention and is provided in the context of a patent application and its requirements. Various modifications to the embodiments and the generic principles and features described herein can be made. Thus, the present invention is not intended to be limited to the embodiments shown, but is to be accorded the widest scope consistent with the principles and features described herein.

The present invention is mainly described in terms of particular systems provided in particular implementations. For example, the system is described for use with wireless local area network (WLAN). However, this method and system may operate effectively in other implementations. For example, the systems, devices, and networks usable with the present invention can take a number of different forms, such as use with Wi-Max (Worldwide Interoperability for Microwave Access) technology. The present invention will also be described in the context of particular methods having certain steps. However, the method and system operate effectively for other methods having different and/or additional steps not inconsistent with the present invention.

Figure 1:
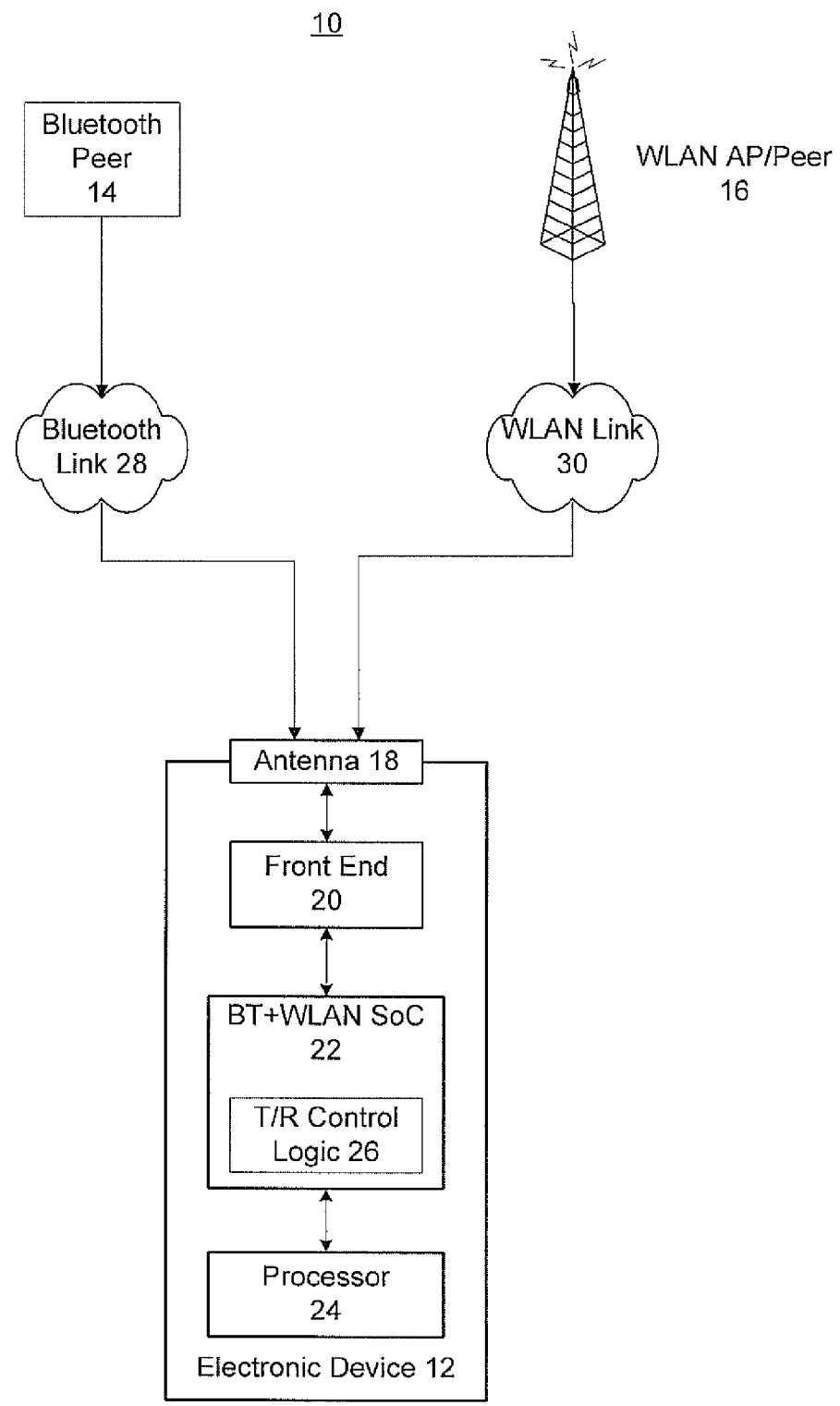
FIG. 1 illustrates an exemplary embodiment of a system architecture for coexistence of Bluetooth and WLAN in an electronic device.

FIG. 1 illustrates an exemplary embodiment of a system architecture for coexistence of Bluetooth and WLAN in an electronic device. The system 10 includes an electronic device 12, a Bluetooth peer 14 and a WLAN peer 16 (which includes WLAN access points) 16. Electronic device 12 may be any device operative to utilize both Bluetooth and WLAN transmissions and receptions. The electronic device 12 may be generally any portable, mobile, or hand-held wireless electronic device having Bluetooth and WLAN functionality collocated on the same device. Examples of such electronic devices include cellular handsets, battery-powered media players, portable gaming consoles, smartphones, personal digital assistants (PDAs) and ultra-low-power computing platforms.

The electronic device 12 may include an antenna 18, a radio frequency (RF) front-end 20, a Bluetooth and WLAN system-on-a-chip 22 (hereinafter referred to as SOC 22), and a host processor 24. The electronic device 12 can utilize a shared antenna 18 to maintain a Bluetooth link 28 with the Bluetooth peer 14, and to maintain a WLAN link 30 with the WLAN peer 16. In other embodiments, more than one antenna can be used to provide the functionality of the antenna 18. The RF front-end 20 is coupled between the antenna 18 and the SOC 22, and the SOC 22 is coupled to the host processor 24.

In one embodiment, the RE front-end 20 and the SOC 22 may provide integrated Bluetooth baseband/RF and 802.11a/b/g WLAN for the electronic device 12. The SOC 22 acts as a communication module or transceiver for both WLAN and Bluetooth. In one embodiment, the SOC 22 may incorporate Layer 3 networking support (TCP/IP+UDP) and has the ability to run supplicants (e.g., which are IEEE 802.1X/WPA components used in client stations for key negotiation, controlling roaming and IEEE 802.11 authentication/association of the WLAN driver) natively, offloading WLAN functionality from the host processor 24. The SOC 22 may also support all Bluetooth profiles with an industry standard HCI interface, and hence, has the ability to run Bluetooth profiles natively, offloading Bluetooth functionality from the host processor 24. The SOC 22 can be connected to the host processor 24 using either a unified host interface or independent host interfaces for WLAN and Bluetooth connections.

The SOC 22 includes transmit/receive (T/R) control logic 26 that controls operation of the RF front-end 20 to permit substantially simultaneous transmitting and receiving of Bluetooth signals and WLAN signals, as described below. The T/R control logic 26 may be implemented as software, hardware, or a combination of both.

Figure 2:
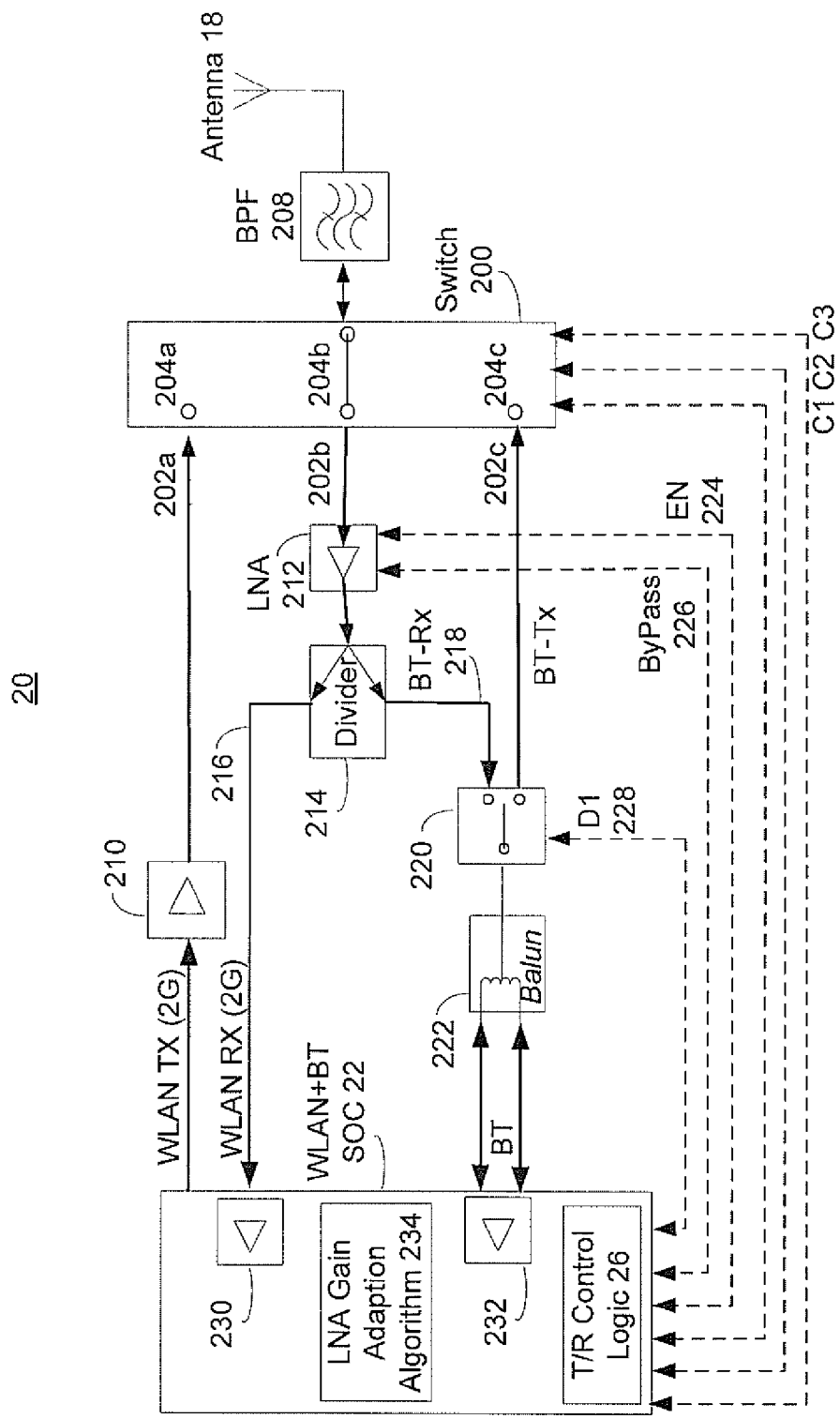
FIG. 2 is a block diagram illustrating a RF front-end architecture according to one embodiment.

FIG. 2 is a block diagram illustrating the RF front-end architecture according to one embodiment, where like components from FIG. 1 have like reference numerals. Although the RF front-end architecture 20 is shown for use in electronic device 12 in conjunction with a SOC 22 transceiver, the RF front-end architecture 20 is also applicable to devices having other types of transceivers and collocated WLAN and Bluetooth devices.

In one exemplary embodiment, the RF front-end architecture 20 may include a switch 200, paths 202a, 202b and 202c, a band pass filter (BPF) 208. The band pass filter (BPF) 208 may be coupled between shared antenna 18 and the switch 200 and may function to filter input and output signals to a desired bandwidth. Paths 202a, 202b and 202c may be coupled between the SOC 22 and three transmit and receive (TX/RX) ports 204a, 204b and 204c of the switch 200. Path 202a and port 204a may be dedicated to the transmissions of WLAN signals (WLAN TX). Path 202b and port 204b may be dedicated to simultaneous receptions of the Bluetooth signals and the WLAN signals (BT-RX/WLAN RX). And Port 204c is shown dedicated to the transmission of Bluetooth signals only, but corresponding path 202c may be dedicated to 1) transmissions only of Bluetooth signals (BT-TX) when a WLAN link is active, and 2) transmissions and receptions of the Bluetooth signals (BT-RX) when the WLAN link is active and in a power save state, and when the WLAN link is inactive.

The switch 200 may control which of the three paths 202a, 202b and 202c to connect to the antenna 18. In one embodiment, the switch 200 may be implemented as a single pole triple throw switch (SP3T). The function of the switch 200 is controlled by signals C1, C2 and C3 from the T/R control logic 26 of the SOC 22. For example, C1 may cause the switch 200 to select port 204a, C2 may cause the switch 200 to select port 204b, and C3 may cause the switch 200 to select port 204c, In one embodiment, the path 202a, which is dedicated to WLAN transmissions only, may include a power amplifier (PA) 210 that amplifies the WLAN transmissions. This is used to avoid WLAN transmit power suffering too much loss before the actual analog transmissions from the antenna 18.

In one embodiment, the path 202b may include an amplifier and a divider. The amplifier comprises a low noise amplifier (LNA) 212, although a distributed amplifier could also be used, and the divider 214 comprises a RF divider. The divider 214 allows the path 202b to receive WLAN signals as well as BT signals from the antenna 18, enabling the SOC 22 to receive the WLAN signals and the BT signals simultaneously in time. Since the incoming WLAN and BT receive signals suffer signal strength losses at the BPF 208, the switch 200, and the divider 214, the LNA 212 shared by the received Bluetooth and WLAN signals amplifies both of the signals to compensate for the loss of signal strength. The divider 214 splits the amplified Bluetooth and WLAN signals output by the LNA 212 onto a WLAN receive path 216 and a Bluetooth receive path 218. The WLAN receive path 216 coupled to the SOC 22, while the Bluetooth receive path 218 is used an input Path 202c for Bluetooth receptions. In one embodiment, the LNA 212 may amplify the received Bluetooth signals and the WLAN signals by approximately 14 dB, while the divider 214 may result in a loss of approximately a −3.5 dB on both the WLAN receive path 216 and a Bluetooth receive path 218.

In one embodiment, the LNA 212 may have two input controls, an enable (EN) signal 224 and a bypass signal 226, both originating from the T/R control logic 26. The enable signal 224 can both enable and disable the LNA 212, such that the LNA 212 can be switched OFF to reduce overall current consumption of the RF front-end 20 whenever path 202b is not selected. The bypass signal 226 may cause the Bluetooth signals and WLAN signals to pass through the LNA 212 without amplification when path 202b is selected, but no gain is desired. This is to avoid over-saturation of the WLAN and Bluetooth receive paths 216 and 218 within the SOC 22.

Paths 202b and 202c are further multiplexed using a switch 220, such as a single pole dual throw (SPDT) switch. The switch 220 selects the Bluetooth receive path 218 when the RF front-end 20 is receiving Bluetooth signals on path 202b, and selects the path 202c when the RF front-end 20 is transmitting Bluetooth signals. Signal D1 228 from the T/R control logic 26 controls the selection of the switch 220. Signal D1 228 may be replaced by two separate (or derived) signals from the SOC 22 because in the embodiment where the switch 220 comprises a SPDT switch, two discrete inputs are used, in which case, the other input to the switch could be a logical NOT of the first input in some cases.

The output of the switch 220 may be coupled to a balun 222, which in turn is coupled to the SOC 22. A balun joins a balanced line (one that has two conductors, with equal currents in opposite directions, such as a twisted pair cable) to an unbalanced line (one that has just one conductor and a ground, such as a coaxial cable).

In one embodiment, the path 202c serves three mutually exclusive functions. 1) When operating alongside the co-located WLAN peer 16 and assuming an active WLAN link 30, the path 202c is dedicated for Bluetooth transmissions only. 2) When operating alongside the co-located WLAN peer 16 and assuming an active WLAN link 30 but in power save state (i.e., a doze state), path 202c is dedicated for both Bluetooth transmissions and receptions. 3) When operating alongside the co-located WLAN peer 16 and assuming an inactive WLAN link 30 (e.g., WLAN is switched OFF in device 12), path 202c is used for Bluetooth transmissions as well as receptions.

The logic to switch the ports 204a, 204b, and 204c on the switch 200 is within the T/R control logic 26 of the SOC 22. This logic is configurable depending upon the type of Bluetooth traffic, the type of WLAN traffic, and on the individual state of each of the two co-located bluetooth peer 14 and the WLAN peer 16 devices. Table I shows a logical truth table that could be used to implement the control signals C1, C2, C3, and D1 during different WLAN and BT states, where X means does not matter.

TABLE 1

|  | WLAN TX BT awake | WLAN TX BT OFF | WLAN RX BT awake | WLAN RX BT OFF |
|---|---|---|---|---|
| C1 | 1 | 1 | 0 | 0 |
| C2 | 0 | 0 | 1 | 1 |

TABLE 1-continued

|  | WLAN TX BT awake | WLAN TX BT OFF | WLAN RX BT awake | WLAN RX BT OFF |
|---|---|---|---|---|
| C3 | 0 | 0 | 0 | 0 |
| D1 | X | X | X | X |
| Results | Path 202a | Path 202a | Path 202b | Path 202b |

The columns in Table I show which of the paths 202a, 202b, and 202c are used with the WLAN peer 16 either transmitting (Tx) or receiving (Rx), and also with the co-located Bluetooth peer 14 in either an Awake or a turned Off state simultaneously.

TABLE 2

|  | BT TX WLAN awake | BT TX WLAN sleep | BT TX WLAN OFF | BT RX WLAN awake | BT RX WLAN sleep | BT RX WLAN OFF |
|---|---|---|---|---|---|---|
| SP3T C1 | 0 | 0 | 0 | 0 | 0 | 0 |
| SP3T C2 | 0 | 0 | 0 | 1 | 0 | 0 |
| SP3T C3 | 1 | 1 | 1 | 0 | 1 | 1 |
| SPDT D1 | 1 | 1 | 1 | 0 | 1 | 1 |
| Results | Path 202c | Path 202c | Path 202c | Path 202b | Path 202c | Path 202c |

Similarly, Table 2 shows which of the paths 202a, 202b, and 202c are used when Bluetooth peer 14 is transmitting (Tx) or receiving (Rx) and with the WLAN peer 16 in either the Awake, Sleep or turned Off state. Awake states in the above two tables mean idle; in other words, the collocated device is powered up but is not maintaining an active link with any nearby device.

Table 3 shows possible examples of port transitions in switch 200. The transitions occur only when the SOC 22 decides to move between paths. For example, the first port transition is a transition from Bluetooth transmit to WLAN transmit. The reverse transitions also apply accordingly in the reverse direction for all the shown combinations.

TABLE 3

|  | BT_TX → WL_TX | BT_RX → WL_TX | WL_RX → BT_TX | WL_RX → WL_TX | WL_TX → WL_RX |
|---|---|---|---|---|---|
| SP3T C1 | 0 –> 1 | 0 –> 1 | 0 –> 0 | 0 –> 1 | 1 –> 0 |
| SP3T C2 | 0 –> 0 | 1 –> 0 | 1 –> 0 | 1 –> 0 | 0 –> 1 |
| SP3T C3 | 1 –> 0 | 0 –> 0 | 0 –> 1 | 0 –> 0 | 0 –> 0 |
| SPDT D1 | 1 –> X | X –> X | X –> 1 | X –> X | X –> X |
| Results | Path 202c to Path 202a | Path 202b to Path 202a | Path 202b to Path 202c | Path 202b to Path 202a | Path 202a to Path 202b |

The following describes additional points about switch transitions. In one embodiment, there are no switch transitions for Bluetooth receive to WLAN receive, and for WLAN receive to Bluetooth receive. This enables simultaneous WLAN receive and Bluetooth receive, i.e., on-going receptions on one of these two paths 204a or 202c will not be interrupted due to a higher priority receptions expected on the other path. In one embodiment, the default state of the switch 200 is path 202b. Thus, the switch 200 will switch to path 202b if there are no other pending requests for transmissions or receptions.

As described above, the RF front-end 20 has an LNA 212 that is external to the SOC 22. In conventional devices, a LNA typically has a fixed gain, such as 14 dB for example. This fixed gain may affect WLAN and Bluetooth performance when the Bluetooth peer 14 and/or the WLAN peer 16 are located in proximity to the electronic device 12, which is a WLAN+Bluetooth combo device. Such proximity may saturate receivers in the SOC 22 quicker than expected without the LNA 212 in place. In addition to the external LNA 212, the SOC 22 includes an internal WLAN LNA 230 on the individual WLAN receive (WLAN RX) path 216 and a Bluetooth LNA 232 on the Bluetooth receive (BT RX) path 218. The maximum gain on both of the internal LNAs 230 and 232 may be adjustable. The saturation by the LNA 212 needs to be avoided because if the Bluetooth receiver becomes saturated due to the LNA 212 gain, the quality of Bluetooth device (e.g., a headset) may be directly affected. Similarly, if the WLAN receiver becomes saturated because of the LNA gain 212, the data or the device connection on the WLAN link may be directly affected.

According to a further aspect of the exemplary embodiment, the SOC 22 is provided with a LNA gain adaptation algorithm 234 that may be used to control and change the LNA gain of the RF front-end architecture 20. The LNA gain adaptation algorithm 234 may be implemented in software, hardware, or both. In one embodiment, the LNA gain adaptation algorithm 234 utilizes the bypass signal 226 to adapt the gain of the LNA 212 based on received signal strength indications of the Bluetooth signals and the WLAN signals, as described below.

Figure 3:
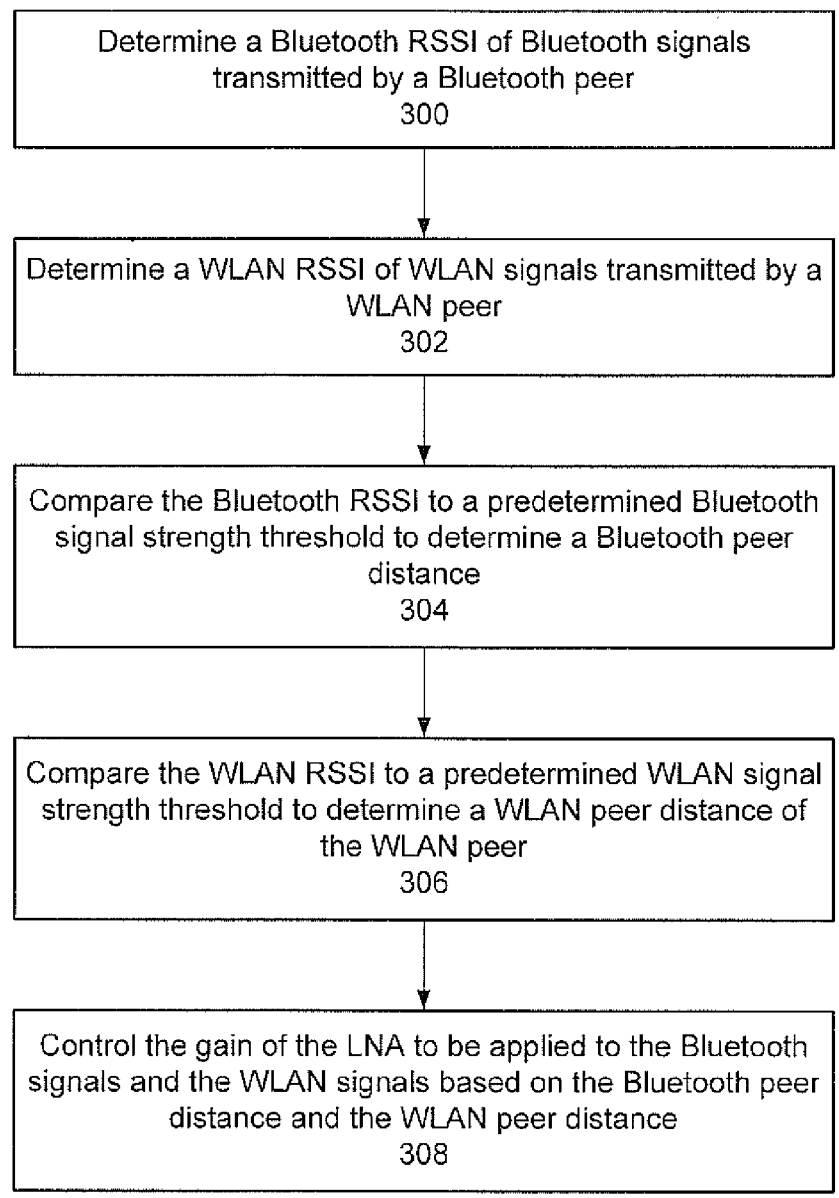
FIG. 3 is a diagram illustrating a process for adapting maximum LNA gain in the RF front-end in accordance with an exemplary embodiment.

FIG. 3 is a diagram illustrating a process for adapting maximum LNA gain in the RF front-end 20 in accordance with an exemplary embodiment. The process may include the LNA gain adaptation algorithm 234 determining a Bluetooth received signal strength indication of Bluetooth signals transmitted by a Bluetooth peer 14 (300), and determining a WLAN received signal strength indication of WLAN signals transmitted by a WLAN peer 16 (302). Hereinafter, the received signal strength indications will be referred to as RSSI for brevity. As is known in the art, RSSI is a measurement of the power present in a received radio signal, which can be ascertained when a receiving device uses wireless networking of the IEEE 802.11 protocol. In one embodiment, the RSSI is done prior to Bluetooth and WLAN baseband signals reaching the LNA 212. RSSI output may be a DC analog level, or may be sampled by an internal ADC and the resulting codes made available directly or via a peripheral or internal processor bus.

The LNA gain adaptation algorithm 234 compares the Bluetooth RSSI to predetermined Bluetooth signal strength threshold(s) to determine a Bluetooth peer distance (304), and compares the WLAN RSSI to predetermined WLAN signal strength threshold(s) to determine a WLAN peer distance (306). Examples of the Bluetooth signal strength threshold(s) and the WLAN signal strength threshold(s) include the following:

If Bluetooth RSSI>=X db, then the Bluetooth peer distance=Near
If Bluetooth RSSI<X db, then the Bluetooth peer distance=Far
If WLAN RSSI>=Y db, then the WLAN peer distance=Near
If WLAN RSSI<Y db, then the WLAN peer distance=Far As described above, the Bluetooth and WLAN signal strength thresholds may include Bluetooth and WLAN RSSI values, e.g., "X" and "Y" as well as associated Bluetooth and WLAN peer distance values or conditions, e.g., "Near" and "Far". When a Bluetooth or WLAN RSSI matches one of the predetermined Bluetooth or WLAN RSSI values, e.g., "X" or "Y", the corresponding Bluetooth and WLAN peer distance value, e.g., "Near" or "Far", is assigned to the Bluetooth or WLAN peer distance.

In an exemplary embodiment, predetermined Bluetooth and WLAN RSSI values may be stored in a memory of the SOC 22 and may be configurable by a user. In another embodiment, the Bluetooth and WLAN peer distance values may also be configurable. The Bluetooth and WLAN peer distance values are shown enumerated as, "Near" and "Far". However, in an alternative embodiment, the Bluetooth and WLAN peer distance values may be enumerated with numbers and/or stated as a range of numbers. Although only two Bluetooth and WLAN peer distance values are shown, the Bluetooth and WLAN signal strength thresholds may include any number of RSSI values and distance values depending on the application.

Referring again to FIG. 2, the LNA gain adaptation algorithm 234 controls the gain the LNA 212 applies to the Bluetooth signals and the WLAN signals based on the Bluetooth peer distance and the WLAN peer distance (308). In an exemplary embodiment, the LNA gain adaptation algorithm 234 controls the gain of the LNA 212 by instructing the T/R control logic 26 to toggle the bypass signal 226 between two settings, Bypass-Off and Bypass-On. The Bypass-On setting places the LNA 212 in a bypass mode in which the Bluetooth signals and WLAN signals pass through the LNA 212 without a gain being applied. The Bypass-Off setting places the LNA 212 in a fixed gain mode in which a fixed gain is applied to the Bluetooth signals and the WLAN signals. In one embodiment, the bypass signal 226 may be set to the Bypass-On setting by default.

In a further embodiment, the LNA gain adaptation algorithm 234 can also be configured to use the bypass signal 226 to control the internal WLAN LNA 230 and the Bluetooth LNA 232 to optimize the overall performance of the electronic device 12. Table IV shows how four cases of WLAN and Bluetooth peer distance values/conditions determined through RSSI values can be used to control both external LNA gain as well as internal LNA gains.

TABLE IV

| | Distance of WLAN Peer | Distance of BT Peer | Bypass signal to ext. LNA | Internal WLAN LNA | Internal BT LNA |
|---|---|---|---|---|---|
| 1 | Near | Far | Bypass OFF | low gain | high gain |
| 2 | Far | Near | Bypass OFF | high gain | low gain |
| 3 | Near | Near | Bypass ON | low gain | low gain |
| 4 | Far | Far | Bypass OFF | med/high gain | med/high gain |

In the first row of Table IV, when the WLAN peer distance is Near and the Bluetooth peer distance is Far, the LNA gain adaptation algorithm 234 toggles the bypass signal 226 to the Bypass-Off setting so that the LNA 212 is placed in a fixed gain mode to boost the WLAN and Bluetooth signals. In response to the Bypass-Off setting, the T/R control logic 26 may set the internal WLAN LNA 230 to low gain, and the internal Bluetooth LNA 232 to high gain.

In the second row of Table IV, when the WLAN peer distance is Far and the Bluetooth peer distance is Near, the LNA gain adaptation algorithm 234 toggles the bypass signal 226 to the Bypass-Off setting so that the LNA 212 is placed in a fixed gain mode. In response to the Bypass-Off setting, the T/R control logic 26 may set the internal WLAN LNA 230 to high gain, and the internal Bluetooth LNA 232 to low gain.

In the third row of Table IV, when the WLAN peer distance and the Bluetooth peer distance are both Near, the LNA gain adaptation algorithm 234 toggles the bypass signal 226 to the Bypass-On setting so that the LNA 212 is placed in bypass mode since the WLAN and Bluetooth signals do not require a gain. In response to the Bypass-On setting, the T/R control logic 26 may set both the internal WLAN LNA 230 and the internal Bluetooth LNA 232 to low gain.

In the fourth row of Table IV, when the WLAN peer distance and the Bluetooth peer distance are both Far, the LNA gain adaptation algorithm 234 toggles the bypass signal 226 to the Bypass-Off setting so that the LNA 212 is placed in the fixed gain mode. In response to the Bypass-Off setting, the T/R control logic 26 may set the internal WLAN LNA 230 to a medium or high gain, and the internal Bluetooth LNA 232 to a medium or high gain.

Bypass ON or OFF may have little impact on the overall current consumption of the electronic device 12 but an adaptable gain protects the WLAN and Bluetooth receive paths from being saturated even though the peer transmitting device is very close.

A method and system for LNA gain adaption based on a received signal strength indication of Bluetooth and WLAN signals has been disclosed. The present invention has been described in accordance with the embodiments shown, and there could be variations to the embodiments, and any variations would be within the scope of the present invention. For example, the present invention can be implemented using hardware, software, a computer readable medium containing program instructions, or a combination thereof. Software written according to the present invention is to be either stored in some form of computer-readable medium such as memory or CD-ROM, and is to be executed by a processor. Accordingly, many modifications may be made without departing from the scope of the appended claims.

What is claimed is:

1. A method for controlling a gain of a low noise amplifier to be applied to i) a first signal from a first communication device, and ii) a second signal from a second communication device, wherein i) the first signal conforms to a first communication protocol, and ii) the second signal conforms to a second communication protocol, the method comprising:
   determining a first signal strength indicator corresponding to a signal strength of the first signal;
   determining a second signal strength indicator corresponding to a signal strength of the second signal; and
   controlling the gain of the low noise amplifier based on at least i) the first signal strength indicator and ii) the second signal strength indicator.

2. The method of claim 1, further comprising
   determining, based on the first signal strength indicator, a first distance value corresponding to a distance of the first communication device; and
   determining, based on the second signal strength indicator, a second distance value corresponding to a distance of the second communication device,
   wherein controlling the gain of the low noise amplifier is further based on at least the first distance value and the second distance value.

3. The method of claim 2, wherein:
   determining the first distance value comprises determining the first distance value based on a comparison the first signal strength indicator to a first predetermined threshold; and
   determining the second distance value further comprises determining the second distance value based a comparison of the second signal strength indicator to a second predetermined threshold.

4. The method of claim 3, wherein controlling the gain of the low noise amplifier comprises placing the low noise amplifier into one of at least i) a bypass mode in which the low noise amplifier does not amplify the first signal and the second signal, and ii) a fixed gain mode in which the low noise amplifier applies a fixed gain to the first signal and the second signal.

5. The method of claim 4, wherein controlling the low nose amplifier further comprises placing the amplifier into the bypass mode when i) the first distance value meets a first condition and ii) the second distance value meets the first condition.

6. The method of claim 5, wherein controlling the low nose amplifier further comprises placing the low noise amplifier into the fixed gain mode when
   i) the first distance value meets the first condition, and the second distance value meets a second condition, or
   ii) the first distance value meets the second condition, and the second distance value meets the first condition, or
   iii) the first distance value meets the second condition, and the second distance value meets the second condition.

7. The method of claim 6, wherein the first condition corresponds to a near distance condition, and the second condition corresponds to a far distance condition.

8. The method of claim 1, further comprising controlling, based on the first signal strength indicator, a gain of a first amplifier other than the low noise amplifier to be applied to the first signal.

9. The method of claim 8, further comprising controlling, based on the second signal strength indicator, a gain of a second amplifier other than the low noise amplifier to be applied to the second signal.

10. The method of claim 1, wherein the first communication protocol is a Bluetooth protocol, and the second communication protocol is a wireless local area network (WLAN) protocol.

11. An apparatus, comprising:
   a radio frequency front end configured to receive i) a first signal from a first communication device, and ii) a second signal from a second communication device, wherein i) the first signal conforms to a first communication protocol, and ii) the second signal conforms to a second communication protocol, and wherein the radio frequency front end comprises
      a radio frequency path common to the first signal and the second signal, and
      a low noise amplifier coupled to the radio frequency path, the low noise amplifier having a gain; and
   a communication module configured to
      determine a first signal strength indicator corresponding to a signal strength of the first signal,
      determine a second signal strength indicator corresponding to a signal strength of the second signal, and
      control the gain of the low noise amplifier based on at least the first signal strength indicator and the second signal strength indicator.

12. The apparatus of claim 11, wherein the communication module is further configured to:
- determine, based on the first signal strength indicator, a first distance value corresponding to a distance of the first communication device; and
- determine, based on the second signal strength indicator, a second distance value corresponding to a distance of the second communication device,
- wherein the communication module is further configured to control the gain of the low noise amplifier based on at least the first distance value and the second distance value.

13. The apparatus of claim 12, wherein
- the first distance value is determined based on a comparison of the first signal strength indicator to a first predetermined threshold; and
- the second distance value is determined based on a comparison of the second signal strength indicator to a second predetermined threshold.

14. The apparatus of claim 13, wherein the communication module is configured control the gain of the low noise amplifier by placing the low noise amplifier into at least one of i) a bypass mode in which the low noise amplifier does amplify the first signal and the second signal, and ii) a fixed gain mode in which the low noise amplifier applies a fixed gain to the first signal and the second signal.

15. The apparatus of claim 14, wherein the communication module is configured to place the low noise amplifier into the bypass mode when i) the first distance value meets a first condition and ii) the second distance value meets the first condition.

16. The apparatus of claim 15, wherein the communication module is configured to place the low noise amplifier into the fixed gain mode when
- i) the first distance value meets the first condition, and the second distance value meets a second condition, or
- ii) the first distance value meets the second condition, and the second distance value meets the first condition, or
- iii) the first distance value meets the second condition, and the second distance value meets the second condition.

17. The apparatus of claim 16, wherein the first condition corresponds to a near distance condition, and the second condition corresponds to a far distance condition.

18. The apparatus of claim 11, wherein the communication module includes a first amplifier to be applied to the first signal, and wherein the communication module is further configured to control a gain of the first amplifier based on the first signal strength indicator.

19. The apparatus of claim 18, wherein the communication module includes a second amplifier to be applied to the second signal, and wherein the communication module is further configured to control a gain of the second amplifier based on the second signal strength indicator.

20. The apparatus of claim 11, wherein the first communication protocol is a Bluetooth protocol, and the second communication protocol is a wireless local area network (WLAN) protocol.

\* \* \* \* \*